United States Patent [19]

Fujita et al.

[11] 3,777,288

[45] Dec. 4, 1973

[54] PLURAL BAND CHANNEL SELECTOR HAVING SELECTOR KNOBS CONTROLLING RESPECTIVE ONES OF A PLURALITY OF TUNERS

[75] Inventors: Osamu Fujita; Takaya Kitao, both of Fujisawa, Japan

[73] Assignee: Matsushita Electric Industrial Co., Ltd., Osaka-fu, Japan

[22] Filed: May 25, 1972

[21] Appl. No.: 256,743

[30] Foreign Application Priority Data

May 31, 1971 Japan .............................. 46/37951

[52] U.S. Cl. .................... 334/1, 325/459, 325/464, 334/47

[51] Int. Cl. ............................................ H03j 5/12

[58] Field of Search ........................ 325/458–460, 325/461–464; 334/1, 2, 3, 7, 15, 334/47, 87

[56] References Cited

UNITED STATES PATENTS

| | | | |
|---|---|---|---|
| 3,503,018 | 3/1970 | Cavanagh | 334/15 |
| 3,568,112 | 3/1971 | Thomas | 334/1 |
| 3,693,093 | 9/1972 | Russell | 334/15 X |

*Primary Examiner*—Paul L. Gensler
*Attorney*—Milton J. Wayne et al.

[57] ABSTRACT

A channel selector is provided which has means for detecting the channel selector knobs of a VHF and UHF tuner touched by a viewer so that in response to the signal from the detecting means, the VHF or UHF tuner may be automatically energized whereas the other tuner is deactivated. Thus, only the desired tuner is energized in channel selection, and the channel selection may be made in one step.

8 Claims, 17 Drawing Figures

PLURAL BAND CHANNEL SELECTOR HAVING SELECTOR KNOBS CONTROLLING RESPECTIVE ONES OF A PLURALITY OF TUNERS

BACKGROUND OF THE INVENTION

The present invention relates to a television receiver having a plurality of tuners for reception of television channels in different frequency bands.

In the conventional television receivers, generally two steps are required to select a UHF channel when a VHF channel had previously been received. That is, the VHF channel selector must be first so operated as to select the UHF band, and then a UHF channel selector must be operated to select a desired UHF channel. Therefore, the UHF channel selection is rather cumbersome.

SUMMARY OF THE INVENTION

The present invention relates therefore to a channel selector for a television receiver of the type in which one of a plurality of tuners whose channel selector knob is touched by a viewer may be automatically energized whereas the other tuners remain de-activated. The most important feature of the present invention is that a desired channel may be selected by one step when the viewer turns or touches the channel selector knob of a tuner of a desired frequency band.

The above and other objects, features and advantages of the present invention will become more apparent from the following description of the preferred embodiments thereof taken in conjunction with the accompanying drawing.

DESCRIPTION OF THE PREFERRED EMBODIMENTS

Figure 1:
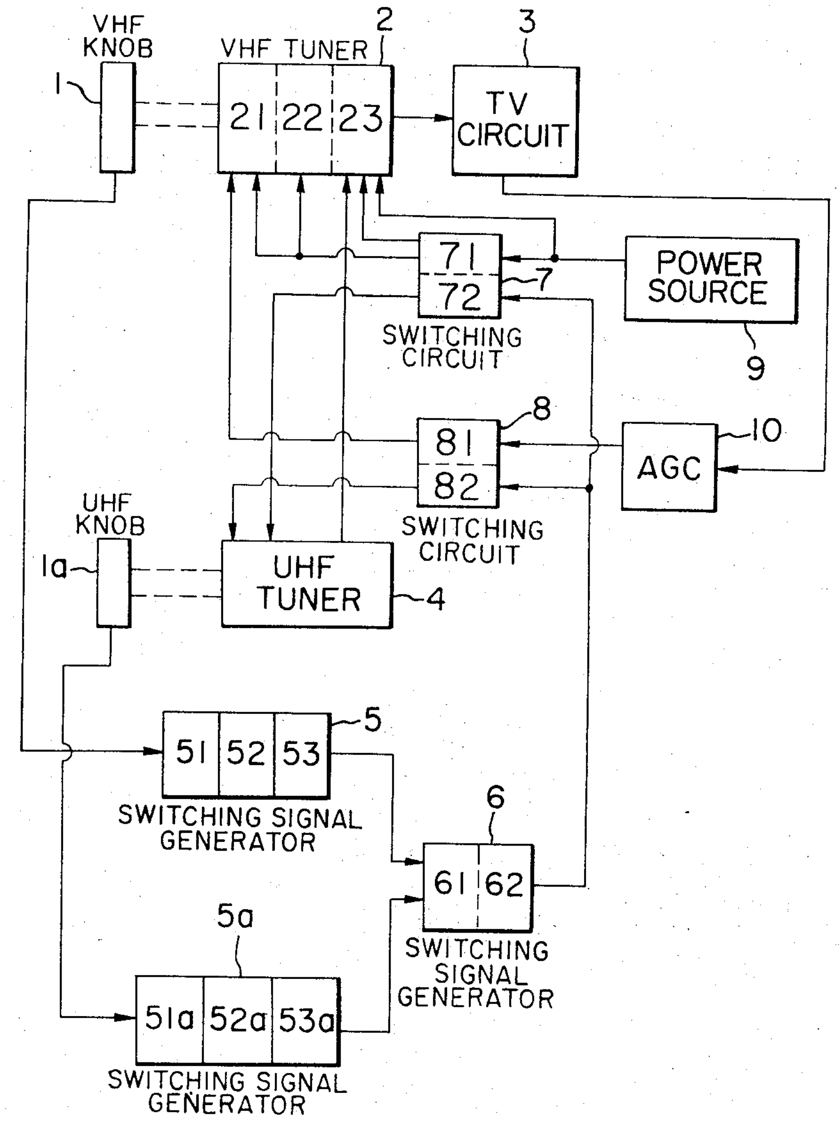
FIG. 1 is a block diagram of a television receiver incorporating a channel selector in accordance with the present invention.

A television receiver incorporating a channel selector in accordance with the present invention illustrated in block diagram in FIG. 1 generally comprises a channel selection knob 1 of a VHF tuner at least the upper surface of which is made of an electrically conducting material; a channel selection knob **1*a* of a UHF tuner at least the surface of which is made of an electrically conducting material; the VHF tuner 2 comprising a high frequency amplifier circuit 21, a local oscillator circuit 22, and a mixer circuit 23, a TV receiver including all circuit component parts except those shown particularly in FIG. 1; the UHF tuner 4; a first switching signal generator 5 comprising an oscillator 51, a detector 52 and a wave shaping circuit 53; a second switching signal generator 5*a* comprising an oscillator 51*a*, a detector 52*a*** and *a* waveform shaping circuit **53*a*; a third switching signal generator 6 which in response to the output signals from the first and second switching signal generators 5 and 6, selects either of switching circuits 7 or 8; the first switching circuit 7 for switching the output of a power source 9; and the second switching circuit 8 for selectively switching the output of an AGC circuit to the UHF tuner 4 or to the VHF tuner 2**.

Next the mode of operation will be described. When the viewer touches the channel selection knob 1 in order to select one of the channels in the VHF band, the first and third switching signal generators 5 and 6 are activated so that in response to the signal from the third signal generator 6 the switching circuit 7 causes the power source 9 to supply the power to the high frequency amplifier 21 and the oscillator 22 in the VHF tuner 2. It should be noted that no power is supplied to the UHF tuner 2, however. In this case, the switching circuit 8 is activated to supply the AGC voltage to the high frequency amplifier 21 in the VHF tuner 2 from the AGC circuit 10, the AGC voltage being not supplied to the UHF tuner 4. Since the mixer circuit 23 is always supplied with the power, the VHF tuner 2 is now activated so that a desired VHF channel may be selected by the VHF knob 1.

When the viewer touches the UHF channel selector knob **1*a* to select a desired channel in the UHF band, the second and third signal generators 5*a* and 6 are activated so that the switching circuit 7 switches the power supply to the UHF tuner 4, that is to the high frequency amplifier circuit and the oscillator circuit thereof. In this case the power supply to the VHF tuner 2 is interrupted. The switching circuit 8 is also actuated so that the supply of the AGC voltage to the VHF tuner 2 is interrupted and switched to the UHF tuner 4. The mixer circuit 23 in the VHF tuner 2 is so designed that it serves as the mixer circuit of the VHF tuner when the high frequency circuit 21 and the oscillator circuit 22 in the VHF tuner 2 are supplied with the power, but serves as an intermediate frequency amplifier for the UHF tuner when the power supply to the high frequency circuit 21 and the oscillator circuit 22 in the VHF tuner 2 is interrupted so that the amplified intermediate frequency signals may be fed into the TV circuitry 3. Therefore the UHF tuner 4 is now activated so that the desired UHF channel may be selected by the UHF channel selector knob 1*a***.

From the above description, it is seen that in accordance with the present invention, any desired UHF channel may be selected by one step.

Figure 2A:
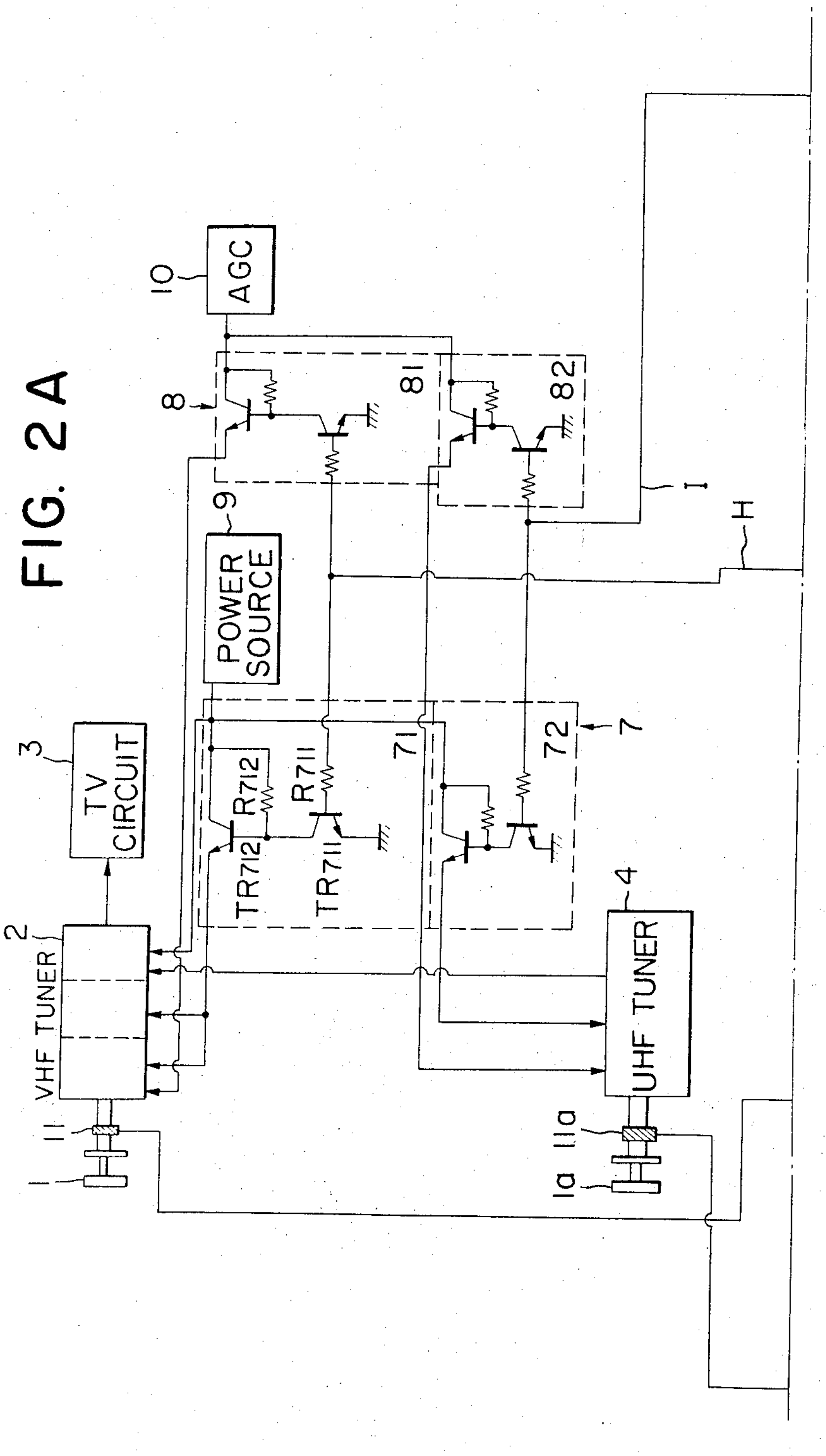
FIGS. 2A and 2B are circuit diagrams of the essential circuit components thereof.
Figures 2A, 2B:
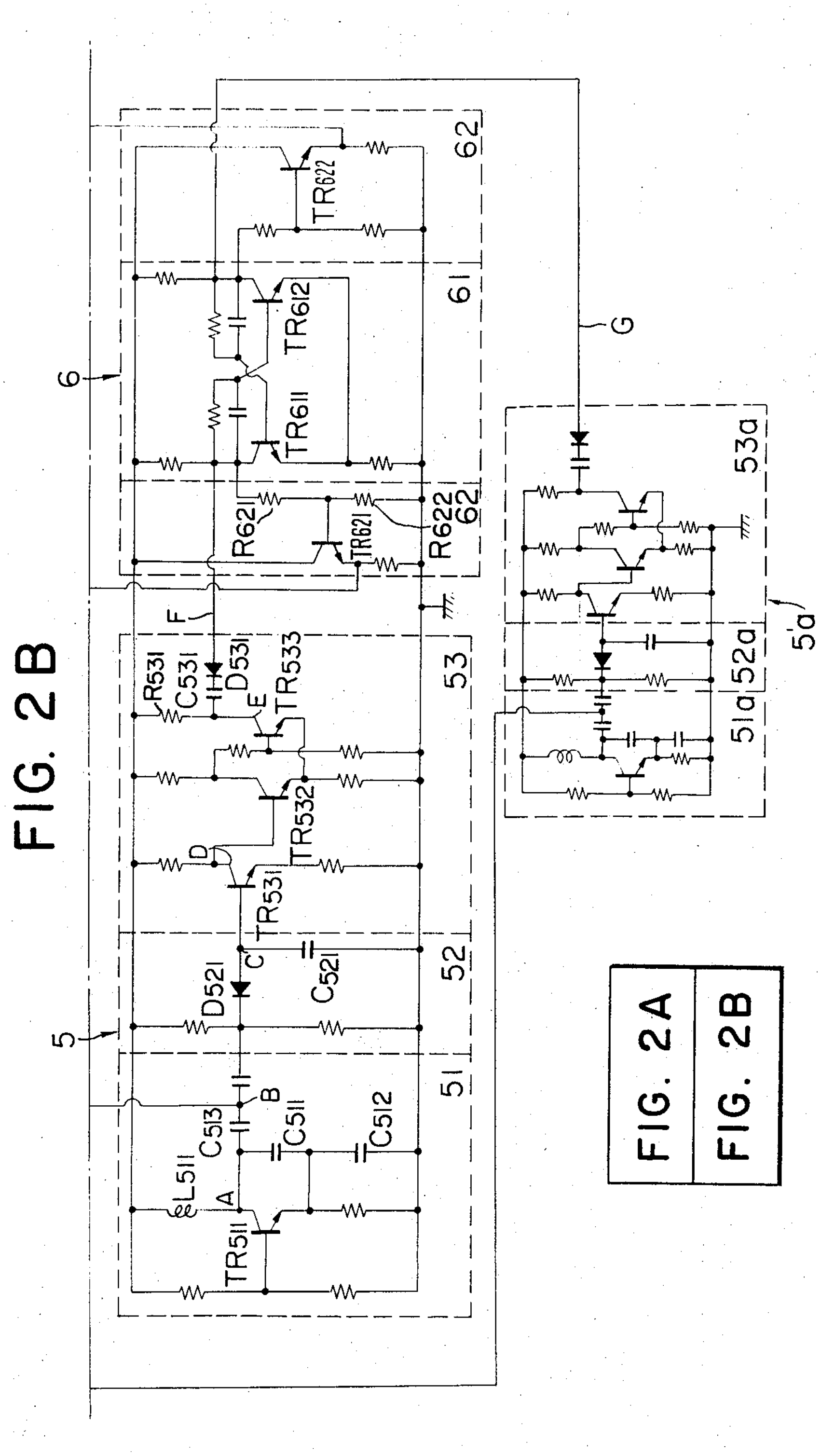

Next referring to FIGS. 2A and 2B illustrating the practical circuit diagram of the first embodiment described so far with reference to FIG. 1, the first and second switching signal generators will be first described in more detail. Since the first and second switching signal generators 5 and **5*a* are similar in construction and in mode of operation, it will suffice to explain only the first switching signal generator 5. The switching signal generator 5 generally comprises a Colpits oscillator circuit 51, a detector circuit 52 and a Schmitt trigger circuit 53**.

Figures 3A, 3B, 3C, 3D, 3E, 3F, 3G, 3H, 3I:
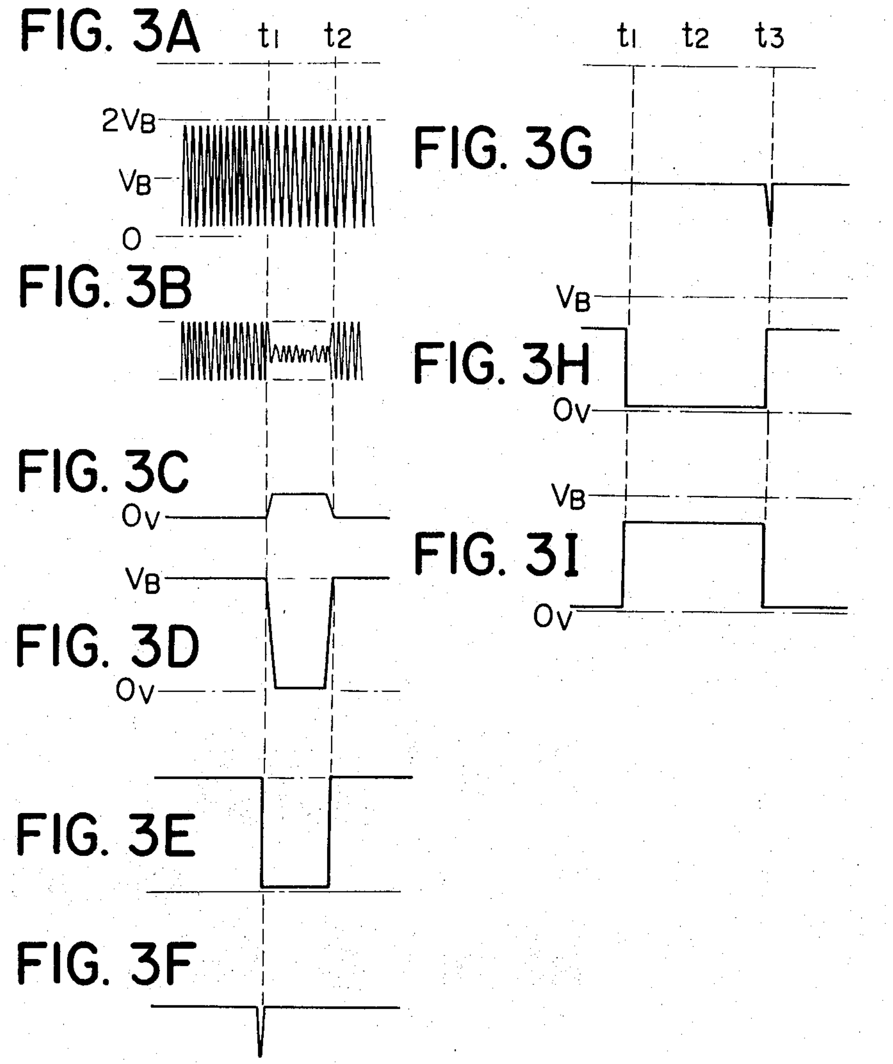
FIGS. 3A – 3I illustrate the waveforms of the signals derived at various points in the circuit shown in FIG. 2 for facilitating the understanding of the mode of operation thereof.

The oscillator circuit 51 comprises a transistor $TR_{511}$ and oscillates at a frequency determined upon a coil $L_{511}$ and two capacitors $C_{511}$ and $C_{512}$. As shown in FIG. 3A, the oscillation output having an amplitude substantially two times that of the power source voltage $V_B$ may be derived from the collector A of the transistor $TR_{511}$.

When the viewer touches the VHF channel selector knob 1, the equivalent earth capacitance of a human body is interconnected between the earth and a junction B in the Colpits oscillator 51 because the junction B is electrically connected to a contace element 11 of the selection knob 1 so that the oscillation output of the oscillator 51 at the junction A is divided by the equivalent earth capacitance of the human body and the capacitance of a capacitor $C_{513}$. As a result, the amplitude of the signal at the junction B is decreased as shown in FIG. 3B. However, when the viewer touches the channel selection knob, the amplitude decreases as shown between time $t_1$ and $t_2$.

The output voltage at the junction B is detected by the detector circuit 52 comprising a diode $D_{521}$ and a capacitor $C_{521}$. The detected output voltage at a junction C in the detector 52 rises only during the time interval between $t_1$ and $t_2$ as shown in FIG. 3C.

A transistor $TR_{531}$ in the Schmitt trigger circuit 53 conducts only when the output voltage at the junction C rises as shown in FIG. 3C during the time interval between $t_1$ and $t_2$ so that the signal as shown in FIG. 3D is derived from the collector D of the transistor $TR_{531}$. This signal is applied to the Schmitt trigger circuit comprising transistors $TR_{532}$ and $TR_{533}$ so that the pulse output signal as shown in FIG. 3E is derived. The pulse shown in FIG. 3E is differentiated into the negative polarity pulse having the waveform as shown in FIG. 3F by a differentiation circuit comprising a capacitor $C_{531}$ and a resistor $R_{531}$ $D_{531}$. The negative pulse shown in FIG. 3F is 531 and by a diode to a flip-flop comprising transistors $TR_{611}$ and $TR_{612}$ as the trigger pulse. The flip-flop 61 is so arranged that when the trigger pulse is applied, the transistor $TR_{612}$ is cut off whereas the transistor $TR_{611}$ is saturated so that the emitter potential at the emitter H of the transistor $TR_{621}$ becomes lower whereas the potential at the emitter I of the transistor $TR_{622}$ becomes higher.

When the negative trigger pulse is applied from the second switching signal generator *5a*, the transistor $TR_{611}$ is cut off whereas the transistor $TR_{612}$ is saturated so that the potential at the emitter H becomes higher whereas the potential at the emitter I becomes lower. The emitter potential variations are illustrated in FIGS. 3H and 3I. In summary, when the negative pulses are applied to the flip-flop 61 at the time $t_1$ from the first switching signal generator 5 and at the time $t_2$ from the second switching signal generator *5a*, the emitter potentials of the transistors $TR_{611}$ and $TR_{612}$ vary in the opposite directions as shown in FIGS. 3H and 3I. The emitter potentials are applied as the switching signals to the first and second switching circuits 7 and 8.

The first and second switching circuits 7 and 8 comprise two switching circuits 71 and 72; and 81 and 82 respectively, which are all similar in construction and in mode of operation so that it will surfice to explain only the switching circuit 71. The switching circuit 71 comprises two transistors $TR_{711}$ and $TR_{712}$, the former being a gating transistor for controlling the latter. When the potential at the emitter H is low during the time interval from $t_1$ to $t_2$, the transistor $TR_{711}$ is cut off whereas when the potential at the emitter H is high (when $t < t_1$ and $t > t_3$) the transistor $TR_{711}$ is saturated. The above mode of operation may be ensured by resistors $R_{621}$ and $R_{622}$. The resistance of a resistor $R_{712}$ is so selected that when the transistor $TR_{711}$ is cut off the transistor $TR_{712}$ is saturated. When the transistor $TR_{712}$ is saturated, the collector signal, that is the power source voltage is derived from the emitter of the transistor $TR_{712}$ and is fed to the high frequency circuit 21 and the oscillator circuit 22 in the VHF tuner 2. When the transistor $TR_{711}$ is saturated the collector potential of the transistor $TR_{711}$ becomes almost equal to the earth potential so that the transistor $TR_{712}$ is cut off. As a result, no power is supplied to the high frequency amplifier 21 and the oscillator 22. The other switching circuits 72, 81 and 83 operate in a manner substantially similar to that described above.

Next the mode of overall operation of the switching circuits 7 and 8 will be described. When the potential at the emitter H is low whereas the potential at the emitter I is high, the switching circuits 71 and 81 are conducted so that the outputs of the power source 9 and the AGC circuit 10 are supplied to the high frequency circuit 21 and the oscillator 22 in the VHF tuner 2. However, the switching circuits 72 and 82 are cut off so that no power is supplied from the power source 9 and the AGC circuit 10 to the UHF tuner. That is, the VHF tuner is now activated whereas the UHF tuner is de-activated. Thus, the desired VHF channel may be selected and received.

On the other hand when the potential at the emitter H is high whereas the potential at the emitter I is low, the UHF is activated whereas the VHF tuner is de-activated. Thus, the desired UHF channel may be selected and received.

The mixer stage 23 in the VHF tuner 2 serves as the intermediate frequency amplifier when the UHF tuner is activated whereas the VHF tuner 2 is de-activated. Switching between the mixer circuit and the intermediate frequency amplifier may be accomplished by the circuit shown in FIG. 4.

Figure 4:
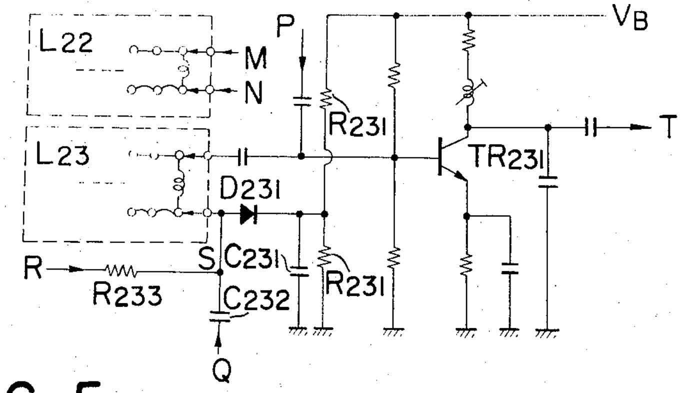
FIG. 4 is a diagram of a switching circuit for switching a circuit denoted by 23 in FIG. 1 to function as a mixer circuit or as an intermediate frequency amplifier.

Referring to FIG. 4, the contacts of the conventional channel selective coils $L_{22}$ and $L_{23}$ are switched to select a desired channel by conventional means. The output of the high frequency amplifier 21 is applied to the points M and N. The output signal of the oscillator circuit is applied to the point P. The intermediate frequency signal from the UHF tuner 4 is applied to the point Q. The output of the switching circuit 71 is applied to the point R. When the potential at the emitter H is low whereas the potential at the terminal I is high, the switching circuit 71 is conducted so that the power is supplied to the high frequency amplifier 21 and the oscillator circuit 23 in the VHF tuner 2. As a result, the power source voltage is applied to the point R so hat the current flows through a resistor $R_{233}$ and a switching diode $D_{231}$ is conducted. As a result, the point S is grounded in a high frequency manner by a capacitor $C_{231}$ so that the circuit 23 functions as the mixer circuit for the VHF tuner 2. Therefore, the intermediate frequency signal is derived from the point T. On the other hand when the potential at the emitter H is high whereas the potential at the terminal I is low, the switching circuit 71 is cut off so that the output becomes equal to the earth potential. As a result the point R has an earth potential so that the switching diode $D_{231}$ is reverse biased. In this case, the intermediate frequency signal from the UHF tuner 2 is applied to the point Q and the amplified output signal is derived from the point T through the coil $L_{23}$ and a transistor $TR_{231}$. Therefore, the circuit 23 now functions as the intermediate frequency amplifier.

In summary, when the viewer touches the VHF channel selector knob in order to select a desired VHF channel, the first switching signal generator is actuated so the negative trigger pulse is derived from the point F. As a consequence, the state of the flip-flop 61 is reversed so that the potential at the emitter H becomes lower whereas the potential at the emitter I becomes higher. Therefore both the switching circuits 71 and 81 are conducted so that the outputs of the power source 9 and the AGC circuit 10 are supplied to the high frequency amplifier 21 and the oscillator 22 in the VHF tuner 2. The circuit 23 functions now as a mixer. Hence, the VHF tuner 2 is activated so that the desired VHF channel may be selected and received. In this case, the switching circuits 72 and 82 are cut off so that the outputs of the power source 9 and the AGC circuit 10 are not supplied to the UHF tuner 2. As a result, no UHF channel can be received.

Next when a UHF channel is desired to be selected, the viewer touches the UHF channel selector knob $1_a$ so that the second switching signal generator $5_a$ is actuated to generate the negative trigger pulse at the point G. The state of the flip-flop 61 is reversed so that the potential at the emitter H becomes higher whereas the potential at the emitter I becomes lower. As a result, the switching circuits 71 and 81 are cut off whereas the switching circuits 72 and 82 are conducted. Therefore, no outputs of the power source 9 and the AGC circuit 10 are supplied to the high frequency amplifier 21 and the oscillator circuit 22 in the VHF tuner 2 whereas the outputs of the power source 9 and the AGC circuit 10 are applied to the UHF tuner 4. The circuit 23 now functions as the intermediate frequency amplifier for the UHF tuner 4. Therefore, the desired UHF channel may be now selected and received.

When one of the VHF channels is switched to another VHF channel the negative pulse is derived from the point F. However this pulse saturates the transistor $TR_{611}$ and cuts off the transistor $TR_{612}$ so that the state of the flip-flop 61 is not reversed. As a result, the reception of the VHF band may be continued. This is also true for the UHF band reception.

In the instant embodiment, the positive voltage is supplied from the power source, and n-p-n transistors are used, but it should be understood that the negative voltage may be supplied from the power source and the p-n-p transistors may be used.

Next a variation of the switching signal generating circuits 5 and $5_a$ will be described with reference to FIG. 5. In the variation the hum signals from the power source are used as the signal source. The selector knob 1 is connected to a terminal X, and the direct current upon which is superimposed the hum voltage of the AC power source is applied to a pair of terminals Y and Z. Reference characters $R_{511}$ and $R_{512}$ denote resistors connected to the base of a transistor $TR_{512}$; $R_{513}$, an collector resistor; $C_{515}$, a smoothing capacitor; and $TR_{532}$ and $TR_{533}$ constitute a Schmitt trigger circuit.

When the viewer touches the selector knob 1, the viewer's earth impedance is interconnected between the earth and the terminal X so that the hum voltage appears across the resistor $R_{511}$. The hum voltage $E_p$ across the resistor $R_{511}$ is given by $$E_p = (R_{511} \cdot E_g / Z_g + Z_s + R_{511} + R_{512})$$

where $Z_g$: impedance of the power source circuit; and $Z_s$: impedance of the viewer to the earth who touches the selection knob.

The voltage $E_p$ is detected and amplified by the transistor $TR_{512}$ and is smoothed by the smoothing circuit comprising the resistor $R_{513}$ and the capacitor $C_{515}$ and applied to the Schmitt trigger circuit.

Figure 5:
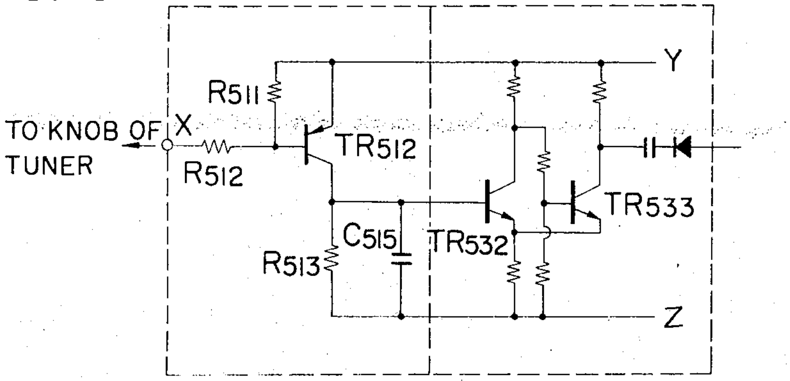
FIG. 5 is a circuit diagram of a variation of switching signal generators denoted by 5 and 5*a* in FIG. 1.
Figures 6A, 6B, 6C:
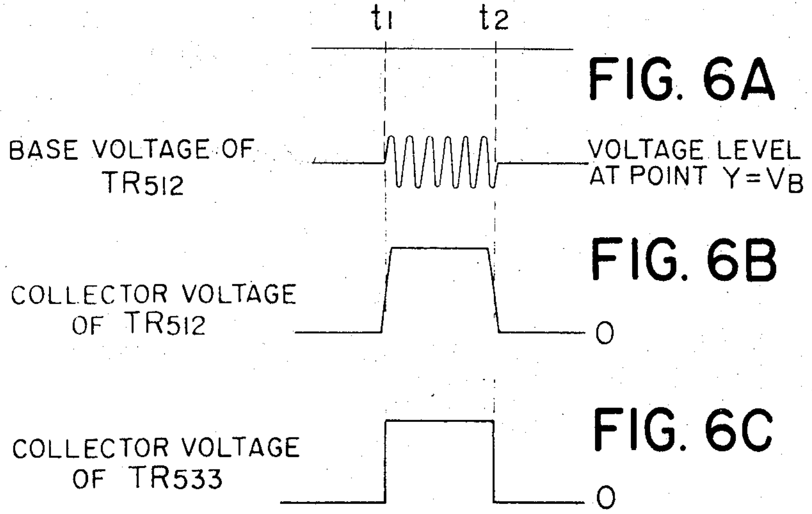
FIGS. 6A – 6C illustrate the waveforms of the output signals derived from various points in the circuit shown in FIG. 5 for facilitating the understanding of the mode of operation thereof.

The mode of operation of the circuit shown in FIG. 5 will be better understood when the reference is made to FIGS. 6A – 6C illustrating the waveforms of the various signals derived at various points in the circuit shown in FIG. 5. When the viewer touches the channel selector knob 1, the hum appears as shown in FIG. 6A during the time interval between $t_1$ and $t_2$. That is, the voltage having the waveform as shown in FIG. 6A is applied to the base of the transistor $TR_{512}$. Then, the collector voltage having the waveform as shown in FIG. 6B is derived from the collector of the transistor $TR_{512}$ whereas the voltage having the waveform as shown in FIG. 6C is derived from the collector of the transistor $TR_{533}$.

In the embodiment and variation illustrated in and described so far with reference to the accompanying drawings, the tuners have been shown and described as being VHF and UHF tuners for a television receiver, but it should be understood that the present invention may be also applied to a tuner of a radio receiver. Furthermore, when the viewer touches the selector knob, this may be detected by a circuit without those of an oscillator in which the viewer is regarded as a resistor having a high resistance.

What is claimed is:

1. A channel selector comprising a. a plurality of tuners each capable of being tuned to a different frequency band, b. a plurality of channel selector knobs with each of said knobs controlling respective ones of said plurality of tuners, c. means for detecting the manual selection of one of said channel selector knobs associated with a desired one of said plurality of tuners, and d. automatic control means connected to said means for detecting for actuating only the selected tuner.

2. A channel selector as defined in claim 1, wherein said automatic control means de-energizes all of said tuners except for said selected tuner.

3. A channel selector unit as defined in claim 1 wherein said means for detecting detects the manual touching of one of said channel selector knobs.

4. A channel selector as defined in claim 3, wherein at least the front surface of each channel selector of said plurality of tuners is made of an electrically conducting material, and said detecting means is provided for each of said plurality of tuners and comprises an oscillator circuit having a frequency output having an amplitude which changes when one of the channel selector knobs is touched, and a detector circuit coupled to said oscillator circuit for sensing the changed amplitude produced when said selector knob is touched.

5. A channel selector as defined in claim 3 wherein at least the front surface of each channel selector of said plurality of tuners is made of an electrically conducting material, and said detecting means is provided for each of said plurality of tuners and comprises a circuit for generating a hum voltage when the channel selector knob is touched and a circuit for detecting said hum voltage.

6. A channel selector as defined in claim 3, wherein said automatic control means is provided for each of said plurality of tuners and comprises a memory circuit which in response to a signal from said detecting means stores a signal representing the touching of said selected channel selector knob of one of said plurality of tuners, a DC power source and an AGC circuit coupled to each of said plurality of tuners through switching circuits, said plurality of tuners being controlled in response to the output from said memory circuit applied to its associated switching circuit.

7. A channel selector as defined in claim 6 wherein each of said plurality of tuners comprises a VHF tuner and UHF tuner, said memory circuit comprising a flip-flop, two detecting means coupled to respective inputs of said flip-flop, the output terminals of said flip-flop being connected to said switching circuit associated with said tuners, to effectuate control of said plurality of tuners.

8. A channel selector as defined in claim 7 wherein said VHF tuner comprises a high frequency amplifier, a local oscillator circuit, and a mixer circuit, a switch inserted in said switching circuits for connecting power to said UHF tuner and to said mixer circuit when the channel selector knob of said UHF tuner is touched, and a selection circuit inserted in said switching circuit for switching said mixer circuit to function as a circuit for amplifying the output of said UHF tuner when the channel selector knob of said UHF tuner is touched.

* * * * *

UNITED STATES PATENT OFFICE
CERTIFICATE OF CORRECTION

Patent No. 3,777,288 Dated December 4, 1973

Inventor(s) Osamu Fujita and Takaya Kitao

It is certified that error appears in the above-identified patent and that said Letters Patent are hereby corrected as shown below:

In column 3, line 10: change "contace" to --contact-- line 35: after "R531" insert --and by a diode-- line 36, "is 531 and by a diodc" should read -- is applied --.

line 62: change "surfice" to --suffice--

In column 5, line 61: change "an" to --a--

Signed and sealed this 15th day of October 1974.

(SEAL)
Attest:

McCOY M. GIBSON JR.
Attesting Officer

C. MARSHALL DANN
Commissioner of Patents

U-Wp-656 Hosh.